United States Patent [19]

Leehey

[11] Patent Number: 4,482,862
[45] Date of Patent: Nov. 13, 1984

[54] CURRENT SENSOR

[75] Inventor: Jonathan R. Leehey, Malden, Mass.

[73] Assignee: The Charles Stark Draper Laboratory, Inc., Cambridge, Mass.

[21] Appl. No.: 387,162

[22] Filed: Jun. 10, 1982

[51] Int. Cl.³ .......................................... G01R 33/00
[52] U.S. Cl. ................................ 324/117 R; 324/127; 330/8; 336/212
[58] Field of Search .......................... 324/117 R, 127; 336/212; 330/8; 307/416, 417, 418

[56] References Cited

U.S. PATENT DOCUMENTS

| | | | |
|---|---|---|---|
| 2,428,613 | 10/1943 | Boyajian . | |
| 3,454,879 | 3/1966 | Smitra | 324/117 R |
| 3,768,011 | 10/1973 | Swain | 324/117 R |
| 4,276,510 | 6/1981 | Tompkins et al. | 324/117 R |
| 4,286,211 | 8/1981 | Nakamura | 324/117 R |
| 4,286,214 | 8/1981 | Milkovic | 324/117 R |
| 4,298,838 | 11/1981 | Akamatsu et al. | 324/117 R |
| 4,314,200 | 2/1982 | Marek | 324/117 R |

OTHER PUBLICATIONS

Groenenboom, M. and Lisser, J., *The Zero-Flux Current Transformer, A Wide Band Measuring Device for AC and DC*, (IEE Conference on Developments in Power Systems Protection, London, 1980).

*Primary Examiner*—Stewart J. Levy
*Attorney, Agent, or Firm*—Kenway & Jenney

[57] ABSTRACT

A current measuring system includes three toroidal magnetic cores. The first core has a non-linear B-H characteristic and being adapted for operation in and between its saturation ranges of its B-H characteristic. The second and third cores are adapted for operation in their substantially non-saturating range of their B-H characteristics. The first core is coupled in a flux oscillator configuration to provide a first error signal representative of low frequency flux changes in the core. The first core and the second core each have noise cancellation windings which are shorted in a manner cancelling noise. A high frequency sensor winding on the third core provides a second error signal representative of intermediate and high frequency flux changes in that core. A feedback network combines the first and second error signals to generate a bucking current which is coupled by way of bucking windings on all three cores. The system is adapted to null flux in the three cores due to flux induced by an input current-to-be-measured on a conductor passing through the three cores.

6 Claims, 3 Drawing Figures

CURRENT SENSOR

BACKGROUND OF THE DISCLOSURE

The present invention is in the field of electrical measurement systems, and more particularly relates to systems for measuring current.

There are many prior art systems for measuring electrical current that are operative from d.c. to relatively high frequencies. One such approach uses a small resistive shunt coupled to a high gain differential amplifier. However, with this approach, to minimize power dissipation, shunts are generally required to be small and consequently suffer from relatively low sensitivity. Moreover, shunts do not provide electrical isolation or common mode rejection.

Another approach incorporates flux nulling in a toroidal magnetic core positioned about the conductor carrying the current to be measured. With this approach, a Hall effect device senses flux in a gap in the core, and in response drives appropriate current in a bucking winding on the core to null the flux induced by the current-being-measured. Within the bandwidth of this nulling feedback loop, the easily measured bucking winding current corresponds to the current being measured. However, the sensitivity of such Hall effect current sensors is very limited due to the fact that the toroidal core must contain an air gap for the Hall effect device. Such devices are also highly sensitive to external magnetic fields and their offset voltage drifts, leading to errors in measurement. Moreover, the circuitry necessary to drive the bucking winding and close the loop must be high gain, low noise, and very stable in order to sense currents in the milliampere region.

Yet other prior art flux nulling techniques are known. Several of these techniques incorporate a core having a square B-H characteristic which is adapted to oscillate as a flux oscillator. In such systems, however, a substantial voltage is generally induced on the input and bucking windings which has substantial effects on the accuracy and stability of the nulling system. Moreover, in general, the prior art flux nulling approaches are characterized by relatively limited frequency ranges of operation.

It is an object of the present invention to provide an improved current sensor.

It is yet another object to provide an improved current sensor operable from d.c. to relatively high frequencies characterized by high accuracy and relatively small offset drift.

Yet another object is to provide an improved current sensor having a relatively large dynamic range.

SUMMARY OF THE INVENTION

Briefly, the present invention is directed to a magnetically isolated current sensor system which includes three toroidal magnetic cores passing about a conductor for which current is to be measured. Each of the cores has a plurality of windings wound thereabout. A first core has a non-linear B-H characteristic. That core is adapted for operation in and between its saturation ranges of its B-H characteristic. The first core has three windings wound about it: a bucking winding, a cancellation winding and a low frequency sensor winding. A second core is adapted for operation in a substantially linear region of its B-H characteristic. The second core has two windings wound about it: a bucking winding and a cancellation winding. A third core is adapted for operation in a substantially linear range of its B-H characteristic. The third core has two windings wound about it: a bucking winding and a high frequency sensor winding. The cancellation windings of the first and second cores are connected in series in a closed loop. The bucking windings of all three cores are connected in series.

The system further includes a network for generating an output signal representative of the current in the bucking windings. By way of example, this network may include a resistor coupled from one end of the series-connected bucking windings to ground potential so that the voltage at the node between the resistor and the bucking windings corresponds to the output signal.

The high frequency sensor winding is coupled to a bandpass filter which generates a first error signal representative of high frequency flux changes in the third core.

A flux oscillator is coupled to the low frequency sensor winding for generating a second error signal representative of low frequency flux changes in the first core. A feedback network combines the first and second error signals and in response to that combination drives a corresponding bucking current through the series-connected bucking windings. The various cores are coupled so that the flux generated in all three cores from the bucking current substantially nulls the flux generated in those cores from the current-to-be-measured. As a result, the output signal is representative of that current to be measured.

In one form, the flux oscillator includes a comparator network, a low power I-switch and a symmetrical clipper, for example, implemented with a Zener diode in a diode bridge. The comparator, I-switch and clipper are connected to the low frequency sensor winding on the first (saturable) core in order to form a flux oscillator. Briefly, the I-switch is responsive to a two-state control signal from the comparator for forming a bipolar driver. The bipolar driver applies voltage to the low frequency sensor winding in a manner alternately driving the first core to saturation first in one direction and then in the opposite direction. The comparator in effect is a saturation detector which detects when the first core has a transition from its unsaturated state to its saturated state (in either direction), and in response to that detection, generates a transition in the two-state control signal. At each transition in the control signal, the I-switch is switched from driving the first core to saturation in one direction to driving that core to saturation in the other direction. Particularly when the core saturates, either in one direction or the other, the magnitude of the current in the oscillator winding becomes large enough to trip the comparator. This in turn changes the state of the I-switch and initiates oppositely directed movement towards saturation by the first core. The symmetrical clipper insures that the positive and negative applied voltages to the low frequency sensor winding are substantially equal in magnitude, producing oscillation with a substantially 50% duty cycle.

Due to the oscillation of flux in the first core, a substantial voltage would tend to be induced in the input and bucking windings on that core. However, the shorted cancellation windings on the first and second cores force the second core to have the same flux oscillation as the first core. Since the second core operates in a substantially linear (non-saturating) B-H region of its B-H characteristic, and has a greater flux capacity than the first core, that second core does not saturate or otherwise substantially effect the flux oscillator. Moreover, since the input and bucking windings are wound about both cores, the second core induces an equal and opposite voltage that cancels the voltage induced by the first core, without requiring an external driver for the second core.

One additional effect of the shorted cancellation turns on the first and second cores, is that substantially all high frequency information is shunted away from the oscillator winding on the first core. Moreover, a low-pass filter is used to filter the oscillator current and extract the average value. In order to achieve a high bandwidth system, a current transformer on the third core is used. This current transformer utilizes the third core, which operates in a substantially linear (non-saturating) B-H region. In practice, this core is effected for detecting current at frequencies greater than 50 Hz.

BRIEF DESCRIPTION OF THE DRAWINGS

The foregoing and other objects of this invention, the various features thereof, as well as the invention itself, may be more fully understood from the following description, when read together with the accompanying drawings in which:

FIG. 1 shows in schematic form, a current measuring system in accordance with the present invention.

DESCRIPTION OF THE PREFERRED EMBODIMENT

Figure 1A:
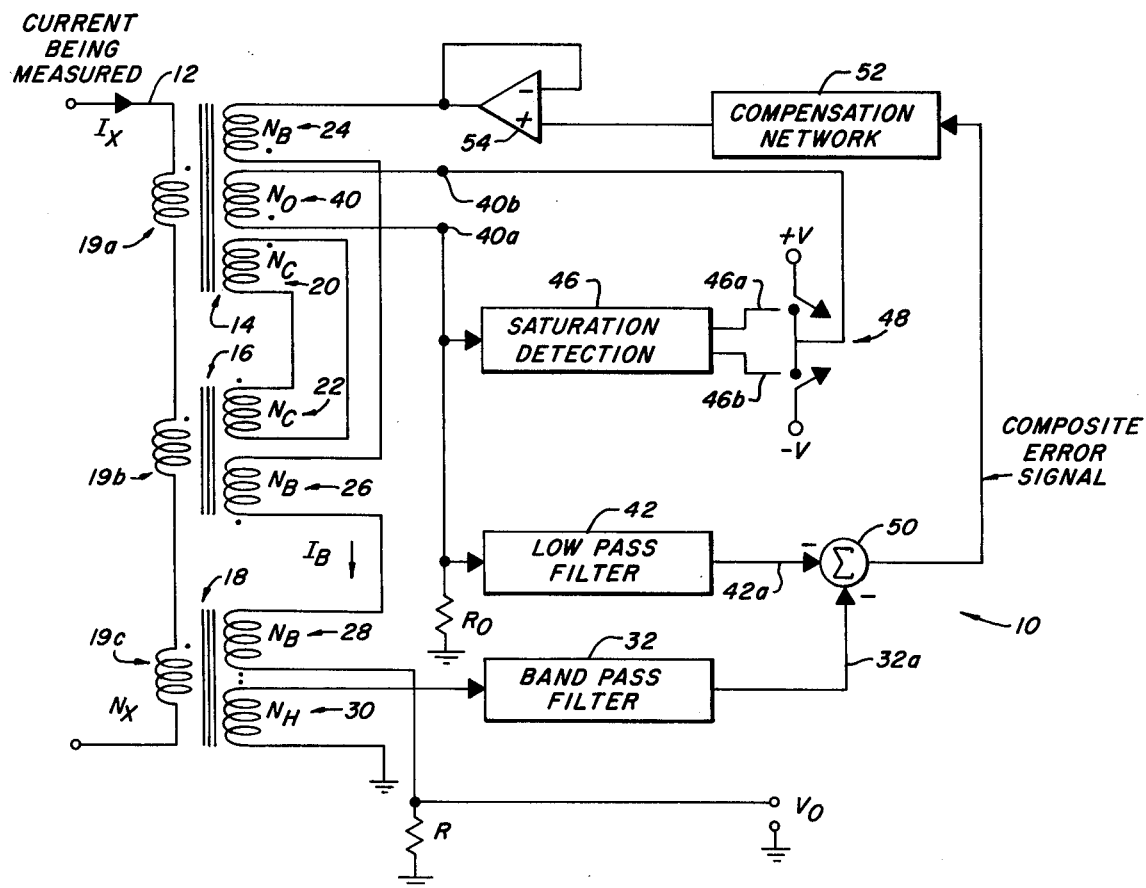
FIG. 1A shows a composite core assembly for the system of FIG. 1.
Figure 1A:
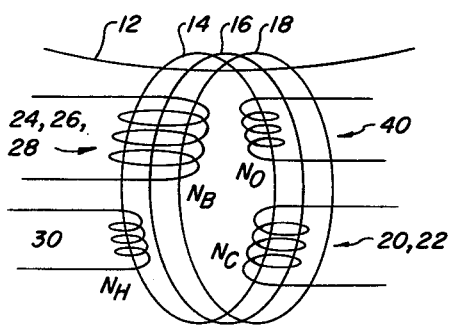

FIG. 1 shows a current sensor system 10 in accordance with the present invention. System 10 includes three magnetic cores: core 14, core 16 and core 18. In the present embodiment, core 14 is made from a non-linear magnetic material, having substantially square B-H characteristic. Cores 16 and 18 are non-saturating ferrite cores, having substantially linear B-H characteristics in their range of operation.

An input conductor 12 has a respective one of input windings 19a, 19b and 19c on one of cores 14, 16 and 18. Winding 19c has $N_X$ turns. The conductor 12 carries the current-to-be-measured, $I_X$.

In the present embodiment, cores 14, 16 and 18 are toroidal cores. The cores 14 and 16 each have noise cancellation windings 20 and 22 respectively with $N_C$ turns. The noise cancellation windings are connected in series in a closed loop.

Each of the cores 14, 16 and 18 also includes a respective one of bucking windings 24, 26 and 28, each having $N_B$ turns. The bucking windings are connected in series, and the bucking winding for core 18 is coupled in series with a resistor R to ground potential. With this configuration, the voltage across the resistor R is a signal representative of the current passing through the bucking windings.

The core 18 also includes a high frequency sensor winding 30 having $N_H$ turns. The high frequency sensor winding 30 is coupled to a bandpass filter 32 and provides a first error signal on line 32a. The first error signal is representative of high frequency flux changes in the core 18.

The core 14 further includes a low frequency sensor winding 40 having $N_0$ turns. The winding 40 is coupled at one end (node 40a) to a resistor $R_0$ passing to ground potential. With this configuration, the voltage across the resistor $R_0$ is a signal representative of the current passing through winding 40. This signal is coupled to a low pass filter 42 to provide a second error signal on line 42a.

FIG. 1A shows a composite core assembly including cores 14, 16 and 18 (shown as solid line loops), where the windings 20 and 22 are provided by a single winding around cores 14 and 16, and the windings 24, 26 and 28 are provided by a single winding around cores 14, 16 and 18. In alternate embodiments, such as in FIG. 1, the windings 20 and 22 may be provided by separate series-connected windings about the respective ones of cores 14 and 16, and the windings 24, 26 and 28 may be provided by separate series-connected windings about the respective one of core 14, 16 and 18.

A saturation detector 46 and a bi-polar driver are coupled across the winding 40 (i.e. nodes 40a and 40b) to form a flux oscillator. The bi-polar driver is responsive to a two-state control signal to alternately apply a voltage across the low frequency sensor winding 40 in a manner driving the core 14 to saturation in first one direction and then in the opposite direction. The saturation detector 46 is adapted to detect points in time when the core 14 becomes saturated and to generate the two-state control signal such that that signal has transitions coincident with points when the core 14 enters saturation (in either direction). As shown, the bi-polar driver is an I-switch having two switches coupled between opposite polarity, equal magnitude power supplies. The control signals on lines 46a and 46b represent controls for operating the switches of the I-switch.

A feedback network includes a summation network 50, compensation network 52 and amplifier 54. The summation network 50 combines the first and second error signals from lines 32a and 42a, respectively, to perform a composite error signal. This signal is modified by network 52 and applied by way of amplifier 54 to the series-connected bucking windings to produce a bucking current $I_B$ resistor R.

With this configuration, the flux generated in the core 14 by the bucking current substantially nulls the flux in that core generated by the current $I_x$. As a result, the voltage drop across resistor R is representative of the current-to-be-measured.

Figure 2:
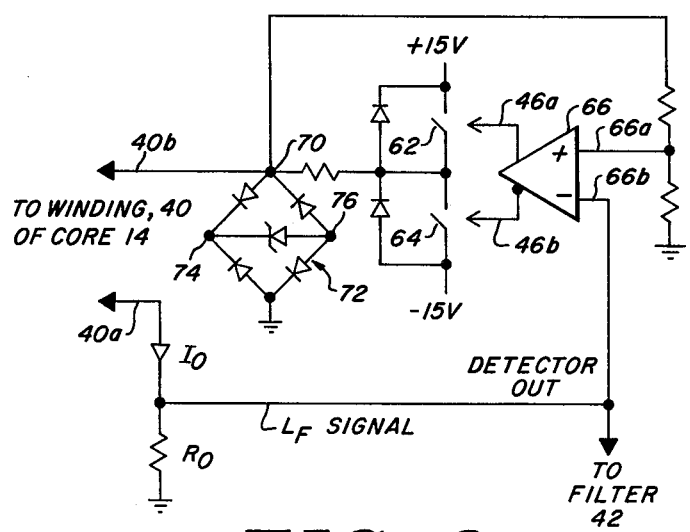
FIG. 2 shows in detailed schematic form, an exemplary saturation detector and bipolar driver for the system of FIG. 1.

FIG. 2 shows a detailed embodiment of the saturation detector 46 and bi-polar driver 48. FIG. 2 shows a two-state I-switch including switches 62 and 64 coupled in series between two opposite polarity 15 volt power supplies. The switches are controlled by a comparator 66 having differential input lines 66a and 66b. Comparator 66 and switches 62 and 64 are interconnected so that when the potential difference between the input lines 66a and 66b of comparator 66 is of one polarity, switch 62 is closed and switch 64 is open. When the potential difference across the terminals 66a and 66b is the other polarity, then switch 62 is open and switch 64 is closed. The junction between switches 62 and 64 is coupled by way of a resistor to one terminal of winding 40 of core 14 (i.e. node 40b). The other terminal of winding 40 (i.e. node 40a) is coupled by way of resistor $R_0$ to ground potential, and also to input line 66b of comparator 66. The first terminal of winding 40 is also coupled back by way of a resistive divider to input line 66a of comparator 66.

A limiter 72 is coupled between node 40b and ground potential to limit voltage excursions at that node between predetermined equal magnitude and opposite polarity limits. The limiter 72 includes a diode bridge coupled between nodes 40b and ground potential. A zener diode is coupled between the intermediate nodes 74 and 76 of bridge 72. In the embodiment illustrated in FIG. 2, the limiter 72 limits excursions of the voltage at node 40b plus or minus 10 volts.

In the present embodiment, windings 19a, 19b and 19c all have one turn; the bucking windings 24, 26 and 28 all have 100 turns; the noise cancellation windings 20 and 22 have 20 turns; the low frequency sensor winding 40 has 50 turns; and the high frequency sensor winding 30 has 50 turns. With this configuration, the system 10 measures current from d.c. to more than 200 KHz with high accuracy and negligible d.c. offset drift. In addition, a dynamic range of one mA to 100 A is provided. The system provides electrical isolation and is not affected by high common mode voltages on the input wire.

In general, the system operates as a D.C. current transformer with the bucking current providing flux nulling. In operation, the saturation in the core 14 is detected by comparing the voltage produced across the resistor R$_0$ with a threshold voltage whose polarity is the same as the polarity of the voltage applied to the core. The threshold voltage is a predetermined percentage of the voltage applied to the core 14. When the core saturates, either in one direction or the other, the magnitude of the current in the oscillator winding is large enough to trip the comparator. This changes the state of the I-switch and initiates the other half-cycle. The symmetrical clipper 72 insures that the positive and negative applied voltages to core 14 are equal in magnitude, and that the threshold voltages of comparator 66 are equal in magnitude, producing an oscillation with a 50% duty cycle. In the low frequency region, the flux introduced by the current I$_x$ is nulled by that produced by the bucking current I$_B$.

Since the flux detector operates by creating oscillation of the flux in the saturating core 14, a substantial voltage tends to be induced in the input and bucking windings. However, the shorted cancellation windings 20 and 22 on the cores 14 and 16 force the core 16 to have the same flux oscillation. The core 16 is made of a ferrite material and has a greater flux capacity than the square saturating loop core 14 so that the core 16 does not saturate or load down and affect the oscillator. Since the input and bucking windings are wound about both cores, the core 16 induces an equal and opposite voltage that cancels the voltage induced by the core 14. In the illustrated embodiment, for example, the voltage on the bucking winding, which would tend to be an approximately 20 volt squarewave without the cancellation windings is reduced to 500 millivolt spikes.

By way of example, the saturating core 14 may be a Magnetics Corporation 80588-1/4D tapewound toroid. The core 14 has a relatively small flux capacity, on the order of 100 maxwells so that it will oscillate at 50 KHz in the present embodiment. The cores 16 and 18 may be Ferroxcube 846-3E2A, for example. Since the operating frequency of the flux oscillator is relatively high, the low pass filter 42 may be a passive two-pole filter at 300 Hz. With that configuration, the sensitivity and offset stability of the present embodiment is better than 1 mA over a plus or minus 1 volt supply variation. The bandwidth of the system is greater than 500 KHz.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

I claim:

1. A system for measuring current in a conductor, comprising:
    A. first, second, and third magnetic cores disposed about said conductor, and a plurality of windings associated with said cores,
        wherein said first core is non-linear and is adapted for operation in and between its saturation ranges of its B-H characteristic, and has a bucking winding, a cancellation winding and a low frequency sensor winding wound thereabout,
        wherein said second core is adapted for operation in a substantially non-saturating range of its B-H characteristic and has a bucking winding and a cancellation winding wound thereabout,
        wherein said third core is adapted for operation in a substantially non-saturating range of its B-H characteristic and has a bucking winding and a high frequency sensor winding wound thereabout,
    B. means for coupling said cancellation windings of said first and second cores in series in a closed loop,
    C. means for coupling said bucking windings of said first, second, and third cores in series, and associated means for generating an output signal representative of the current in said bucking windings,
    D. bandpass filter means coupled to said high frequency sensor winding for generating a first error signal representative of high frequency flux changes in said third core,
    E. flux oscillator means coupled to said low frequency sensor winding for generating a second error signal representative of low frequency flux changes in said first core,
    F. feedback means responsive to said first and second error signals for generating a bucking current representative of a combination of said first and second error signals, and means for coupling said bucking signal to said series connected bucking windings,
    whereby the flux generated in said first, second and third cores from said bucking current substantially nulls flux generated in said first, second and third cores from said current-to-be-measured in said conductor and said output signal is representative of said current-to-be-measured.

2. A system according to claim 1 wherein said flux oscillator comprises:
    a bi-polar driver means responsive to a two-state control signal for alternately applying voltage across said low frequency sensor winding to drive said first core to saturation in alternate directions,
    saturation detector means for detecting when said first core becomes saturated and for generating said two-state control signal, said two-state control signal having transitions coincident with said detection of said first core becoming saturated, and
    LF means for generating an LF signal representative of the current in said low frequency sensor winding.

3. A system according to claim 2 wherein said bipolar driver means and said saturation detection means comprise:
- a two-state I-switch including first and second switches connected in series between a pair of power supplies characterized by opposite polarity potentials,
- switch controller including a comparator having two input terminals and means for coupling said I-switch and said comparator,
  - when the potential difference between said input terminals is one polarity, said I-switch is in one state with the first of said switches closed and the second of said switches open, and
  - when the potential difference between said input terminals is the other polarity, said I-switch is in the other state with the first of said switches open and the second of said switches closed,
- means for coupling the node between said switches to said one side of said low frequency sensor winding and to one of said input terminals,
- means for coupling the other side of said low frequency sensor winding to a fixed potential between the potentials associated with said power supplies,
- means for coupling said LF signal to the other of said input terminals, whereby said I-switch alternately switches states as said first core becomes saturated in alternate directions.

4. A system according to claim 3 wherein said LF means comprises a resistor coupled between said other side of said low frequency sensor winding and said fixed potential and an associated means for generating said LF signal corresponding to the potential difference across said resistor.

5. A system according to claims 3 or 4 wherein said fixed potential is ground potential, and further comprising a limiter means coupled to said one side of said low frequency sensor winding for limiting excursions of the potential to predetermined equal magnitude opposite polarity limits.

6. A system according to claim 5 wherein said limiter means comprises a diode bridge coupled between said one side of said low frequency sensor winding and ground potential, said diode bridge including a zener diode coupled between its intermediate nodes.

* * * * *